United States Patent
Kwon

(10) Patent No.: US 10,115,767 B2
(45) Date of Patent: Oct. 30, 2018

(54) DUAL LIGHT EMISSION MEMBER, DISPLAY APPARATUS HAVING THE SAME AND LIGHTING APPARATUS HAVING THE SAME

(71) Applicant: Samsung Display Co., Ltd., Yongin-Si, Gyeonggi-Do, (KR)

(72) Inventor: Jaejoong Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/464,476

(22) Filed: Mar. 21, 2017

(65) Prior Publication Data
US 2017/0294480 A1    Oct. 12, 2017

(30) Foreign Application Priority Data

Apr. 11, 2016  (KR) .................. 10-2016-0044258

(51) Int. Cl.
| | |
|---|---|
| H01L 51/52 | (2006.01) |
| H01L 27/15 | (2006.01) |
| H01L 27/146 | (2006.01) |
| H01L 27/12 | (2006.01) |
| H01L 33/58 | (2010.01) |
| H01L 33/62 | (2010.01) |

(52) U.S. Cl.
CPC ........ *H01L 27/156* (2013.01); *H01L 27/1214* (2013.01); *H01L 27/14601* (2013.01); *H01L 27/14627* (2013.01); *H01L 33/58* (2013.01); *H01L 33/62* (2013.01); *H01L 51/5262* (2013.01)

(58) Field of Classification Search
None
See application file for complete search history.

(56) References Cited

U.S. PATENT DOCUMENTS

| | | | |
|---|---|---|---|
| 2011/0233570 A1* | 9/2011 | Lee | H01L 51/5253 257/88 |
| 2012/0280894 A1* | 11/2012 | Park | H01L 27/326 345/77 |
| 2014/0159064 A1 | 6/2014 | Sakariya et al. | |
| 2015/0137153 A1 | 5/2015 | Bibl et al. | |
| 2017/0062674 A1 | 3/2017 | Kwon et al. | |

FOREIGN PATENT DOCUMENTS

| | | |
|---|---|---|
| JP | 2009-188237 A | 8/2009 |
| KR | 1020170026959 A | 3/2017 |

* cited by examiner

*Primary Examiner* — Cheung Lee
(74) *Attorney, Agent, or Firm* — Cantor Colburn LLP

(57) ABSTRACT

A dual light-emission member of a display apparatus or a lighting apparatus includes: a substrate including a first area and a second area adjacent to each other, where the second area of the substrate is light-transmissive; a first light-emitting member on the substrate and disposed in the first area of the substrate; and a lens commonly disposed over the first area and the second area of the substrate so as to cover the first light-emitting member.

20 Claims, 13 Drawing Sheets

DUAL LIGHT EMISSION MEMBER, DISPLAY APPARATUS HAVING THE SAME AND LIGHTING APPARATUS HAVING THE SAME

This application claims priority to Korean Patent Application No. 10-2016-0044258, filed on Apr. 11, 2016, and all the benefits accruing therefrom under 35 U.S.C. § 119, the content of which in its entirety is herein incorporated by reference.

BACKGROUND

1. Field

One or more embodiments relate to a display apparatus and a lighting apparatus, and more particularly, to a display apparatus and a lighting apparatus having relatively simple manufacturing processes and small thicknesses.

2. Description of the Related Art

The field of visually displaying electrical information signals has rapidly grown, and correspondingly, various types of display apparatuses having excellent performance, for example, being relatively thin and lightweight and consuming relative low power, have been developed.

Examples of the display apparatuses include a liquid crystal display ("LCD"), an organic light-emitting diode ("OLED") display, an electrophoretic display ("EPD"), a plasma display panel ("PDP"), a field emission display ("FED"), an electro luminescence display ("ELD"), and an electro wetting display ("EWD"). Such display apparatuses include a display panel for displaying an image.

The display apparatuses have advantages of being relatively thin and consuming relatively low power and thus may be manufactured as dual display apparatuses displaying an image on both sides thereof. Particularly, as electronic devices are designed as various types, displays included in the electronic devices have also been designed as folder-types having an outside window and an inside window and displaying an image on both sides thereof. In this regard, research into manufacturing the dual display apparatuses having relatively simple manufacturing processes, increased yield, and relatively small thicknesses has been actively carried out.

SUMMARY

A display apparatus and a lighting apparatus of the related art have a problem in that a plurality of display units each having a separate driving unit are needed for dual emission in a dual display apparatus. Thus, a related art dual display apparatus gets thicker overall and manufacturing processes thereof are relatively complicated.

In order to resolve problems including the above-described problem, one or more embodiments include a display apparatus and a lighting apparatus having relatively simple manufacturing processes and small thicknesses. However, this is an example, and the invention is not limited thereto.

According to one or more embodiments, a display apparatus includes: a first pixel and a second pixel adjacent to each other; a substrate including a first area and a second area respectively corresponding to the first pixel and the second pixel, where a portion of the substrate at the second area is light-transmissive; a first light-emitting member on the substrate and disposed in the first area of the substrate; and a lens commonly disposed over the first area and the second area of the substrate so as to cover the first light-emitting member.

According to one or more embodiments, a portion of the substrate at the first area may be non-transmissive.

According to one or more embodiments, in a direction in which the first and second areas are adjacent to each other, the lens may define a central portion thereof, and with respect to the central portion of the lens, the first area may be at a first side of the central portion of the lens, and the second area may be at a second side of the central portion of the lens opposite to the first side.

According to one or more embodiments, the lens may have a shape of an ellipse which defines a first focus and a second focus thereof.

According to one or more embodiments, for the lens having the shape of the ellipse, a location of the first light-emitting member may correspond to the first focus.

According to one or more embodiments, for the lens having the shape of the ellipse, the second area of the substrate may correspond to the second focus.

According to one or more embodiments, the display unit may further include: a thin film transistor which is disposed in the first area of the substrate and controls the first light-emitting member; and a first electrode electrically connected to the thin film transistor, where the thin film transistor in the first area of the substrate may not be in the second area of the substrate.

According to one or more embodiments, the display unit may further include a bank layer on the substrate and defining a first opening corresponding to the first area and a second opening corresponding to the second area, and the first light-emitting member is disposed in the first opening.

According to one or more embodiments, the display unit may further include a light diffusing layer, the substrate may define a first surface thereof and a second surface thereof opposite to the first surface, the first light-emitting member and the lens may be on the first surface of the substrate, and the light diffusing layer may be on the second surface of the substrate.

According to one or more embodiments, a total of the second area of the substrate may be defined by a first sub-area and a second sub-area adjacent to each other, the lens may commonly cover the first area and the first sub-area of the second area, and the lens may not cover the second sub-area of the second area.

According to one or more embodiments, the display unit may further include a second light-emitting member on the substrate and disposed in the first area of the substrate, and the lens may commonly cover the first and second light-emitting members.

According to one or more embodiments, a wavelength of light emitted from the first light-emitting member may be different from that of light emitted from the second light-emitting member.

According to one or more embodiments, a lighting apparatus includes: a light-emitting panel which generates and provides light to a display unit of a display apparatus, where the display unit generates and displays an image with the light provided from the light-emitting panel. The light-emitting panel includes: a first emission unit and a second emission unit adjacent to each other; a substrate including a first area and a second area respectively corresponding to the first emission unit and the second emission unit, where the second area of the substrate is light-transmissive; a first light-emitting member on the substrate and disposed in the first area of the substrate; and a lens commonly disposed over the first area and the second area of the substrate so as to cover the first light-emitting member.

According to one or more embodiments, the first area of the substrate may be non-transmissive.

According to one or more embodiments, the lens may have a shape of an ellipse which defines a first focus and a second focus thereof.

According to one or more embodiments, for the lens having the shape of the ellipse, a location of the first light-emitting member may correspond to the first focus.

According to one or more embodiments, for the lens having the shape of the ellipse, the second focus may correspond to the second area of the substrate.

According to one or more embodiments, the light-emitting panel further include: a thin film transistor which is disposed in the first area of the substrate; and a first electrode electrically connected to the thin film transistor, where the thin film transistor disposed in the first area of the substrate may not be in the second area of the substrate.

According to one or more embodiments, the light-emitting panel may further include a bank layer on the substrate and defining a first opening corresponding to the first area and a second opening corresponding to the second area, and the first light-emitting member may be disposed in the first opening.

According to the one or more embodiments, the light-emitting panel may further include a light diffusing layer, the substrate may define a first surface thereof and a second surface thereof opposite to the first surface, the first light-emitting member and the lens may be on the first surface of the substrate, and the light diffusing layer may be on the second surface of the substrate.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
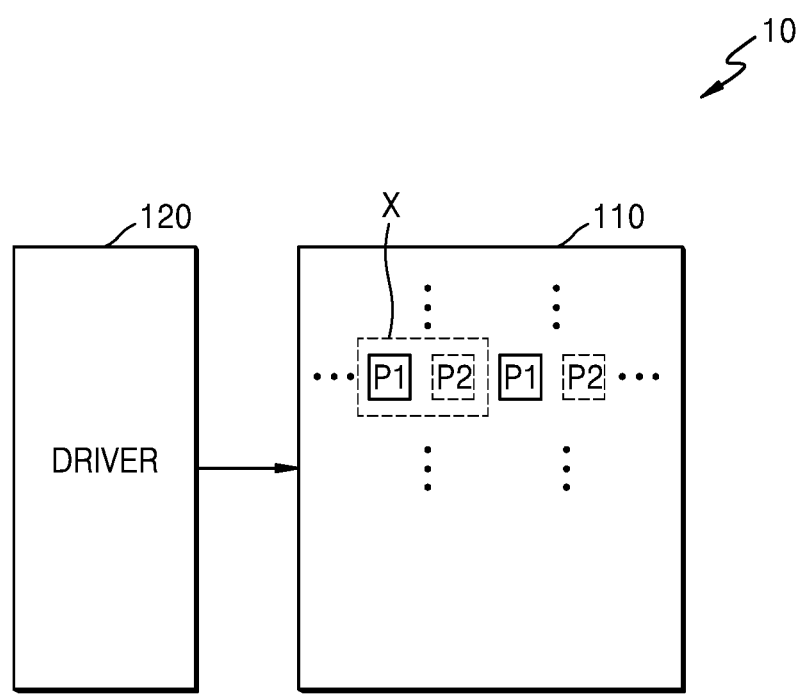
FIG. 1 is a schematic block diagram of an exemplary embodiment of a display apparatus according to the invention.

As the invention allows for various changes and numerous embodiments, certain embodiments will be illustrated in the drawings and described in detail in the written description. Effects and features of the invention and a method of accomplishing them will be apparent by referring to the embodiments described below in detail together with the drawings. However, the invention is not limited to the embodiments set forth below and may be implemented in various forms.

Reference will now be made in detail to embodiments, examples of which are illustrated in the accompanying drawings. When description is made with reference to the drawings, like reference numerals in the drawings denote like or corresponding elements, and repeated description thereof will be omitted.

As used herein, the term "and/or" includes any and all combinations of one or more of the associated listed items. "At least one" is not to be construed as limiting "a" or "an." "Or" means "and/or."

It will be understood that, although the terms "first," "second," etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the present disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following examples, the x-axis, the y-axis and the z-axis are not limited to three axes of the rectangular coordinate system and may be interpreted in a broader sense. For example, the x-axis, the y-axis and the z-axis may be perpendicular to one another or may represent different directions that are not perpendicular to one another.

When an embodiment may be implemented differently, a specific process order may be performed differently from the described order. For example, two consecutively described processes may be performed substantially at the same time or performed in an order opposite to the described order.

FIG. 1 is a schematic cross-sectional view of an exemplary embodiment of a display apparatus 10 according to the invention.

Referring to FIG. 1, the display apparatus 10 may include a display unit 110 (otherwise referred to as a display 110) which displays an image and a driver 120 which applies driving signals to the display 110 to drive the display 110. The display 110 may include a plurality of pixels such as P1 and P2 arranged in a matrix form on a substrate. The plurality of pixels may display the image of the display 110 under control of the driver 120. In an exemplary embodiment, the plurality of pixels may be selectively driven to display the image. The driver 120 may include a scan driver applying a scan signal to the plurality of pixel units P1 and P2 via a scan line of the display 110 respectively connected to the plurality of pixel units P1 and P2, and the driver 120, and/or a data driver applying a data signal to the plurality of pixel units P1 and P2 via a data line of the display 110 respectively connected to the plurality of pixel units P1 and P2, and the driver 120. The scan line and the data line may be provided in plural crossing each other (not shown) within the display 110.

The plurality of pixel units P1 and P2 may be arranged in a display portion of the substrate. The driver 120 may be in a non-display portion of the substrate, which is near the display portion of the display 110 where the plurality of pixel units P1 and P2 are arranged. The driver 120 may be, for example, an integrated circuit chip and directly mounted on the substrate which forms the display 110, mounted on a flexible printed circuit film, attached to the substrate of the display 110 as a tape carrier package (TCP), or directly formed on the substrate of the display 110.

The plurality of pixel units P1 and P2 may include a first pixel unit P1 and a second pixel unit P2. According to the exemplary embodiment, to display an image, the first pixel unit P1 of the display 110 may emit light upwards from a first surface of the substrate, and the second pixel unit P2 of the display 110 may emit light toward downwards from the first surface and toward a second surface of the substrate that is opposite to the first surface in a thickness direction of the display 110. That is, the first pixel unit P1 may be understood as a top emission-type (display) pixel, and the second pixel unit P2 may be understood as a bottom emission-type (display) pixel. The first pixel unit P1 and the second pixel unit P2 may be provided in the display 110 as a pair.

Figure 2A:
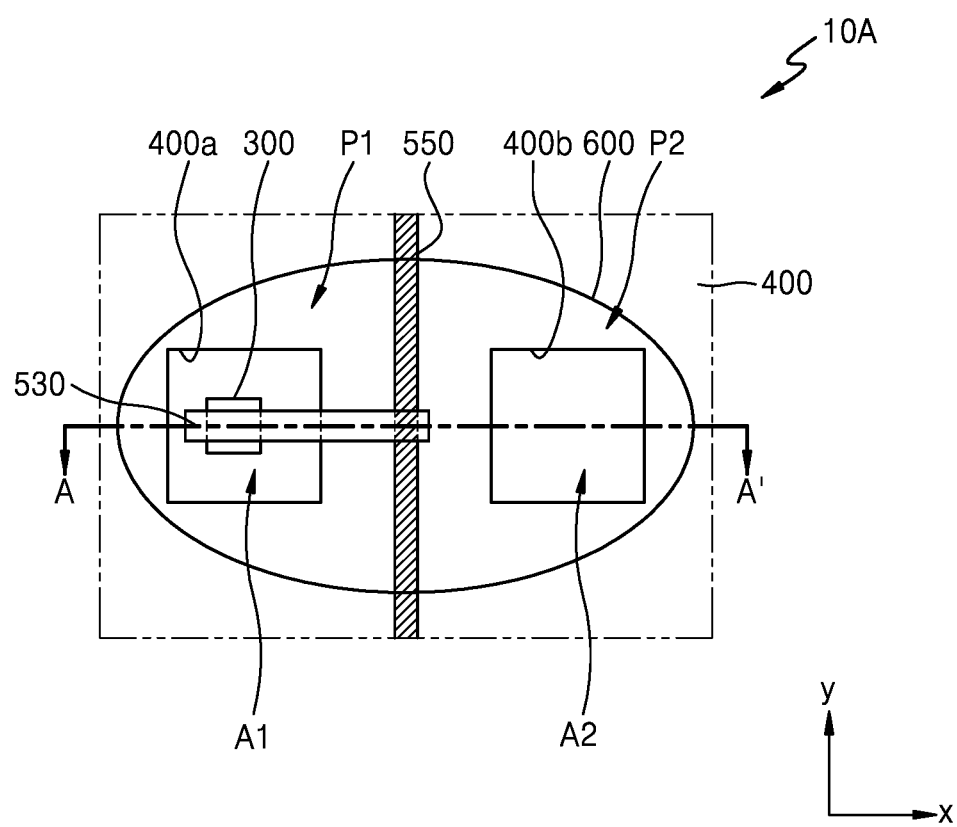
FIG. 2A is an enlarged top plan view illustrating the region X of the display apparatus of FIG. 1.
Figure 2B:
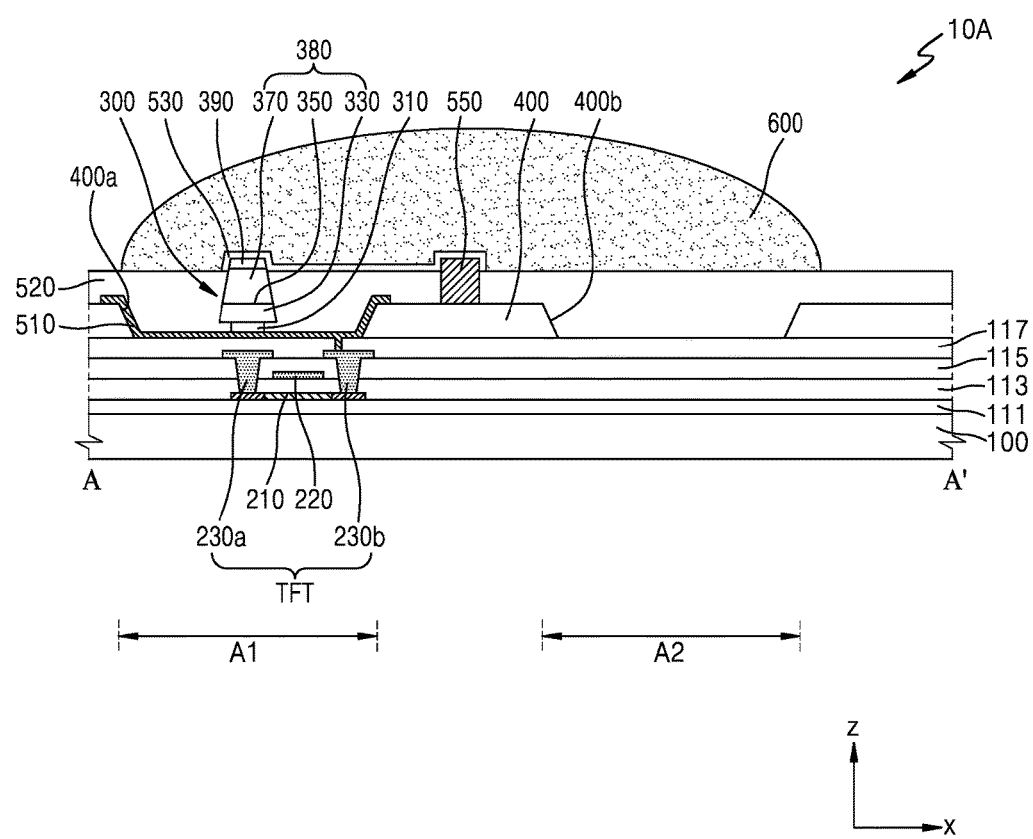
FIG. 2B is a schematic cross-sectional view of the display apparatus of FIG. 2A, taken along line A-A'.

FIG. 2A is an enlarged top plan view illustrating the region X of the display apparatus of FIG. 1, and FIG. 2B is a schematic cross-sectional view of the display apparatus 10A of FIG. 2A, taken along line A-A'.

Referring to FIGS. 2A and 2B together, the display apparatus 10A includes a (base) substrate 100 including a first area A1 and a second area A2, a first light source such as a light-emitting diode ("LED") 300 above the substrate 100, and a lens 600 commonly over the first area A1 and the second area A2 of the substrate 100.

The substrate 100 may include one or more materials, such as glass, metal, or plastic, for example, polyethylene terephthalate ("PET"), polyethylene naphthalate ("PEN"), polyimide, etc. The substrate 100 including one or more of the above-described materials may be rigid or flexible.

According to the exemplary embodiment, the substrate 100 may include the first area A1 and the second area A2 adjacent to each other within the region X. In this regard, the first area A1 may be non-transmissive, and the second area A2 may be light-transmissive. When the first area A1 is non-transmissive, and the second area A2 is light-transmissive, the substrate 100 itself may be non-transmissive or light-transmissive, or various layers and devices may be arranged on the substrate 100. Due to such layers and devices on the substrate 100, the substrate 100 at an area corresponding to the first area A1 may be non-transmissive, and the substrate 100 at an area corresponding to the second area A2 may be light-transmissive.

Also, being non-transmissive or light-transmissive may not denote that light is totally blocked or totally passes through but also that a relatively larger amount of light passes through the second area A2 of the substrate 100, compared with the first area A1 of the substrate 100.

The first pixel unit P1 may include the first LED 300 and a pixel circuit connected to the first LED 300. The pixel circuit may include at least one thin film transistor and at least one capacitor. The pixel circuit is connected to each of a scan line and a data line which cross each other (not shown). In FIG. 2B, only one thin film transistor TFT is shown.

A buffer layer 111 may be provided on the substrate 100, and the thin film transistor TFT may be provided on the buffer layer 111. The buffer layer 111 may reduce or effectively prevent intrusion of impurities through the substrate 100, may planarize a surface of the substrate 100, and/or may include a single layer or layers including an inorganic material such as silicon nitride ($SiN_x$) and/or silicon oxide ($SiO_x$).

The thin film transistor TFT includes an active layer 210, a gate electrode 220, a source electrode 230a and a drain electrode 230b. The active layer 210 may include a semiconductor material and defines a source region, a drain region, and a channel region which is between the source region and the drain region (shown with the different hatching patterns in FIG. 2B).

The gate electrode 220 is disposed or formed above the active layer 210 in the thickness direction of the display 110 so as to correspond to the channel region of the active layer 210. The source electrode 230a and the drain electrode 230b are electrically connected to the source region and the drain region of the active layer 210, respectively. As a gate insulating layer, a first insulating layer 113 is between the active layer 210 and the gate electrode 220, the first insulating layer 113 including an inorganic insulating material.

As an interlayer insulating layer, a second insulating layer 115 is respectively between the gate electrode 220, and the source and drain electrodes 230a and 230b. A third insulating layer 117 is on the source and drain electrodes 230a and 230b as a planarization layer. The second insulating layer 115 and the third insulating layer 117 may each include or be formed using an organic insulating material or inorganic insulating material, or alternating an organic insulating material and an inorganic insulating material.

In an exemplary embodiment, the buffer layer 111, the first insulating layer 113, the second insulating layer 115 and the third insulating layer 117 may each include a transparent or semi-transparent material that is light-transmissive.

Although the thin film transistor TFT of FIG. 2B is a top gate type having a gate electrode above an active layer in the thickness direction, the invention is not limited thereto, and the gate electrode may be below the active layer in the thickness direction to form a bottom gate type thin film transistor TFT.

In addition, according to the exemplary, the thin film transistor TFT may be above or in the first area A1 of the substrate 100. The first area A1 of the substrate 100 is a non-transmissive area, and devices such as the thin film transistor TFT may be arranged at the first area A1 of the substrate 100. In other words, devices including the thin film transistor TFT or wirings may not be arranged at the second area A2 of the substrate 100. The second area A2 of the substrate 100 is a light-transmissive area at which light passes through the second area A2 of the substrate 100. Therefore, devices (e.g., the thin film transistor TFT or wirings) which may degrade light transmission at the second area A2 may not be arranged in a travelling direction of light at the second area A2.

A bank layer 400 may be on the third insulating layer 117 and define a pixel region of the pixels. The bank layer 400 may include or define a first opening 400a corresponding to the first area A1 of the substrate 100 and a second opening 400b corresponding to the second area A2 of the substrate 100. The first LED 300 may be located in the first opening 400a of the bank layer 400. In contrast, the first LED 300 is not in the second opening 400b of the bank layer 400. A height of the bank layer 400 may be determined according to a height and a viewing angle of the first LED 300. The height of the bank layer 400 may be taken from the surface of the third insulating layer 117. Also, sizes (e.g., widths) of the first opening 400a and the second opening 400b may be determined according to factors such as the resolution and pixel density of the display apparatus 10. The widths of the openings defined by the bank layer 400 may be taken in a direction parallel to a plane of the substrate 100 (e.g., x-axis (x) direction or y-axis (y) direction in FIG. 2A, and horizontal (x direction) in FIG. 2B).

In an exemplary embodiment, the height of the first LED 300 may be greater than the height of the bank layer 400. The heights of the first LED 300 and the bank layer 400 may each be taken from a common reference, such as an upper surface of the third insulating layer 117. Although FIG. 2A illustrates an example in which the first opening 400a and the second opening 400b are quadrangles in the top plan view, embodiments are not limited thereto, and the first opening 400a and the second opening 400b may have various shapes, such as polygons, rectangles, circles, circular cones, ovals or triangles, being the same or different from each other.

A conductive layer 550, which is electrically connected to a second electrode 530 to be described later, is on the bank layer 400. Alternatively, although not illustrated, a conductive layer may be omitted, and the second electrode 530 may be formed, as a common electrode that is common to each of the pixel units P1 and P2, entirely over the substrate 100. The conductive layer 550 may be in a direction parallel to the data line or the scan line. In an exemplary embodiment, the conductive layer 550, the data line and the scan line may each define a length thereof larger than a width thereof, and the length of the conductive layer 550 may be parallel to that of the data line or the gate line.

The bank layer 400 may include a material that at least partially absorbs light, a light-reflecting material or a light-scattering material. The bank layer 400 may include an insulating material that is semi-transparent or non-transparent with respect to visible light (for example, light corresponding to a wavelength range of 380 nanometers (nm) to 750 nm). The bank layer 400 may include an organic insulating material, for example, thermoplastic resin such as polycarbonate ("PC"), PET, polyether sulfone ("PES"), polyvinyl butyral ("PVB"), poly(phenylene ether) ("PPE"), polyamide, poly ether imide ("PEI"), norbornene system resin, methacrylic resin, and cyclic polyolefin base, thermosetting resin such as epoxy resin, phenol resin, urethane resin, acrylic resin, vinyl ester resin, imide-based resin, urethane-based resin, urea resin, and melamine resin, polystyrene or polyacrylonitrile, but a material of the bank layer 400 is not limited thereto. The bank layer 400 may include an inorganic insulating material, for example, an inorganic oxide or an inorganic nitride, such as SiOx, SiNx, SiNxOy, AlOx, TiOx, TaOx, and ZnOx, but the material of the bank layer 400 is not limited thereto.

In an exemplary embodiment, the bank layer 400 may include a non-transparent material such as a black matrix material. An insulating black matrix material may include resin or paste including organic resin, glass paste, and black pigment, metal particles, for example, nickel, aluminum, molybdenum, and an alloy thereof, metal oxide particles (for example, chromium oxide), or metal nitride particles (for example, chromium nitride). In another embodiment, the bank layer 400 may be a distributed Bragg reflector ("DBR") having high reflectivity or a mirror reflector formed of metal.

The first LED 300 as a point light source may be in the first opening 400a of the bank layer 400. The first LED 300 may be a micro LED. Here, the term "micro" may refer to a size of about 1 micrometers (μm) to about 100 μm. However, embodiments are not limited thereto, and the first LED may have a larger or smaller size than that described above. In an exemplary embodiment of manufacturing the display apparatus 10, the first LED 300 may be transferred individually or in plural on a wafer such as by a transport mechanism, and transferred onto the substrate 100 and thus may be placed in the first opening 400a of the substrate 100.

In an exemplary embodiment, the bank layer 400 and a first electrode 510 may be disposed or formed above the first area A1 of the substrate 100, and then, the first LED 300 may be placed in the first opening 400a above the first area A1 and on the first electrode 510. In another exemplary embodiment, the conductive layer 550 may be additionally disposed or formed, and then, the first LED 300 may be transferred onto the substrate 100 and thus may be placed in the first opening 400a above the first area A1. The first LED 300 may be a red, green, blue or white LED or an ultraviolet ("UV") LED.

The first LED 300 may include a p-n diode 380, a first contact electrode 310, and a second contact electrode 390. The first contact electrode 310 and/or the second contact electrode 390 may include one or more layers and may be formed using various conductive materials including metal, conductive oxide and conductive polymers. The first contact electrode 310 and the second contact electrode 390 may each optionally include a reflective layer, for example, a silver layer. The first contact electrode 310 is electrically connected to the first electrode 510, and the second contact electrode 390 is electrically connected to the second electrode 530. The p-n diode 380 may include a lower p-doping layer 330, one or more quantum well layers 350, and an upper n-doping layer 370. In another exemplary embodiment, the upper doping layer 370 may be a p-doping layer, and the lower doping layer 330 may be an n-doping layer. In a cross-sectional view, the p-n diode 380 may have a straight side wall or a side wall tapered downward or upward.

The first electrode 510 may be a (semi)transparent electrode or reflective electrode and may include one or more layers. In an exemplary embodiment, for example, the first electrode 510 may include metal such as aluminum, molybdenum, titanium, titanium and tungsten, silver, gold, or an alloy thereof. The first electrode 510 may include a transparent conductive layer including a conductive material, such as a transparent conductive oxide ("TCO"), for example, ITO, IZO, ZnO, or $In_2O_3$, a carbon nanotube film, or a transparent conductive polymer, and a reflective layer. In an exemplary embodiment, the first electrode 510 may be a triple layer including upper and lower transparent conductive layers and a reflective layer between the upper and lower transparent conductive layers.

The second electrode 530 may be a transparent or semi-transparent electrode. In an exemplary embodiment, for example, the second electrode 530 may be formed using a material among the above-described transparent conductive materials and may include one or more materials selected from Ag, Al, Mg, Li, Ca, Cu, LiF/Ca, LiF/Al, MgAg, and CaAg.

In an exemplary embodiment, when, without the conductive layer present, the second electrode 530 is formed as a common electrode above the substrate 100, the second electrode 530 may be formed as a transparent electrode by taking into account light transmission of the second area A2 of the substrate 100.

A passivation layer 520 may be on the bank layer 400 and within the first opening 400a and the second opening 400b. The passivation layer 520 may surround the first LED 300 in the first opening 400a. The passivation layer 520 fills space between the bank layer 400 and the first LED 300 and thus covers the first opening 400a and the first electrode 510. As described above, the passivation layer 520 may fill space in the first opening 400a and the second opening 400b and thus planarize a surface on which the lens 600 is disposed or formed.

The passivation layer 520 may include an organic insulating material that is light-transmissive. In an exemplary embodiment, for example, the passivation layer 520 may include acrylic, poly(methyl methacrylate) ("PMMA"), benzocyclobutene ("BCB"), polyimide, acrylate, epoxy, and polyester, but a material of the passivation layer 520 is not limited thereto. The passivation layer 520 does not cover an upper portion of the first LED 300, for example, the second contact electrode 390, and thus, the second contact electrode 390 is exposed by the passivation layer 520. The second electrode 530, which is commonly electrically connected to the exposed second contact electrode 390 of the first LED 300 and the conductive layer 550, is disposed or formed on the passivation layer 520.

Although FIG. 2B shows a vertical micro LED as an example, one or more embodiments are not limited thereto, and the first LED 300 may be a flip-type micro LED where a first contact electrode and a second contact electrode face the same direction, a horizontal micro LED, or the like. In this case, locations of a first electrode and a second electrode may correspond to those of the first contact electrode and the second contact electrode.

The lens 600 may be on the passivation layer 520. The lens 600 may be commonly over the first area A1 and the second area A2 of the substrate 100 so as to cover the first LED 300. That the lens 600 is over the first area A1 and the second area A2 of the substrate 100 may denote that the lens 600 entirely covers the first area A1 and the second area A2 of the substrate 100 or that the lens 600 at least partially covers the first area A1 and the second area A2 of the substrate 100.

The lens 600 may have an oval shape. Here, the oval shape may be understood as a circle extending or contracting in one direction. This may denote that a portion of a surface of the lens 600 that passes the first LED 300 and crosses an imaginary plane perpendicular to the substrate 100 has an oval shape. In FIG. 2A, a cross section of the lens 600 taken along a plane defined by the x-axis and the y-axis has an oval shape, and in FIG. 2B, a cross-section of the lens 600 taken along a plane defined by the x-axis and the z-axis (z) is a portion of an oval shape. However, the invention is not limited thereto, and it is enough only if the portion of the surface of the lens 600 that passes the first LED 300 and crosses the imaginary plane perpendicular to the substrate 100 has an oval shape, and the entire shape of the lens 600 may be modified by taking into account a factor such as a light extraction amount or direction.

In the exemplary embodiment, with reference to a central portion of the lens 600, the first area A1 may be at one side of the central portion of the lens 600, and the second area A2 may be at the other side of the central portion of the lens 600. When the lens 600 is completely oval, the central portion of the lens 600 may be understood as the center defined by the oval shape. However, when the lens 600 is not completely oval, the central portion of the lens 600 may be understood as an area between a first focus and a second focus, which are to be described below.

An ellipse may be defined by two points, each called a focus, and the sum of distances from a same point on the ellipse to the respective focus points is constant. With reference to an ellipse, the lens 600 having a general oval shape as described above may have a first focus and a second focus. In an optical approach to the first focus and the second focus of the oval, light and radio waves from one focus of an oval mirror plane is reflected by the oval plane and then reaches the other focus. Regardless of the direction in which the light and radio waves are sent from the focus, the result is the same.

Accordingly, in the exemplary embodiment and with reference to an ellipse, the first LED 300 may be at a location corresponding to the first focus of the lens 600. Also, the second focus of the lens 600 may be located so as to correspond to the second area A2 of the substrate 100. Although light emitted from the first LED 300 located at the first focus of the lens 600 basically has properties of travelling straight and thus is emitted in a light-emitting direction (e.g., upwards from the upper surface of the substrate 100), the light is partially reflected by the surface of the lens 600 and incident on the second area A2 of the substrate 100 where the second focus of the lens 600 is located. Through the reflection of the light, top emission occurs in the first area A1 of the substrate 100, and bottom emission (e.g., downwards from the upper surface of the substrate 100) occurs in the second area A2 of the substrate 100 so as to achieve a dual emission display of the display 110.

In the related art, individual display panels each emitting light in one direction are disposed with image-displaying directions opposing each other in order to provide a dual display apparatus, and thus, a dual emission type display apparatus is formed. In the display apparatus including the display (panel) 110 such as one according to one or more exemplary embodiment, since the display (panel) 110 displays an image with light in both of opposing directions, a dual display apparatus may be provided using a single display panel having the above-described structure.

Figure 3:
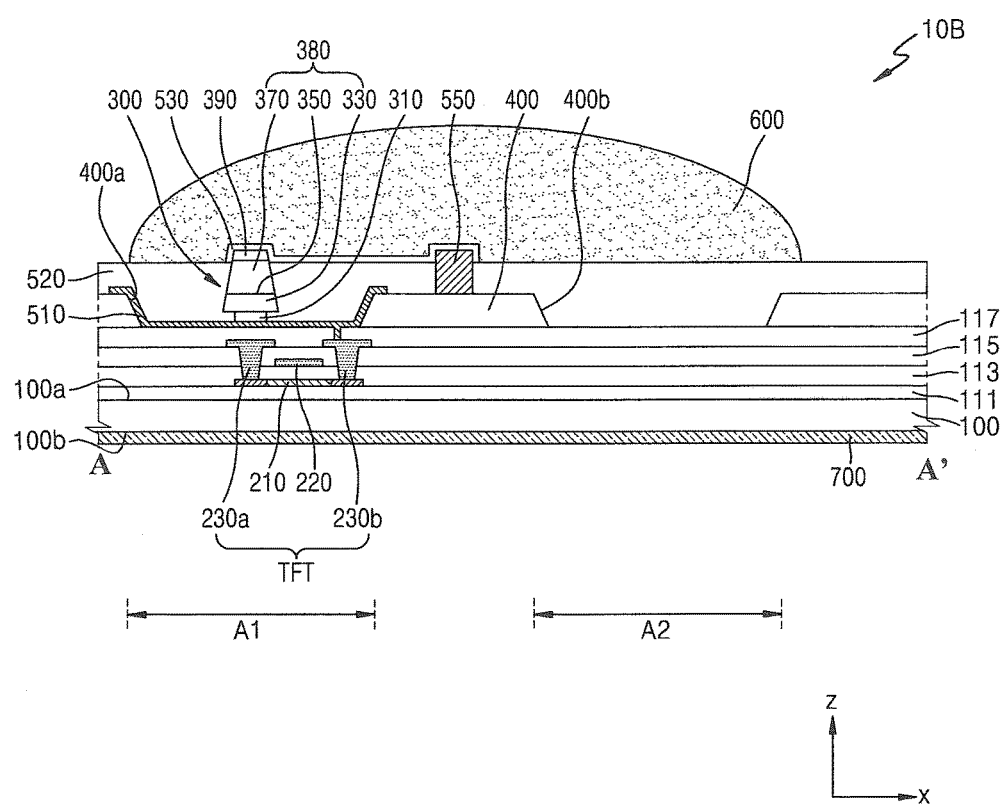
FIG. 3 is a schematic cross-sectional view of another exemplary embodiment of a display apparatus taken along line A-A' of FIG. 2A.

FIG. 3 is a schematic cross-sectional view of another exemplary embodiment of a display apparatus 10B, taken along line A-A' of FIG. 2A.

Referring to FIGS. 2A and 3 together, the display apparatus 10B includes the (base) substrate 100 including the first area A1 and the second area A2, the first LED 300 at an upper surface of the substrate 100, the lens 600 over the first area A1 and the second area A2 of the substrate 100, and a light diffusing layer 700 at a lower surface opposed to the upper surface of the substrate 100.

Elements of the display apparatus 10B according to the exemplary embodiment, except the light diffusing layer 700, are the same as those of the display apparatus 10A described with reference to FIGS. 2A and 2B. Thus, a repeated description thereof will be omitted, and the above description of the display apparatus 10A will be cited. The light diffusing layer 700 will be mainly described hereinafter.

The substrate 100 may include a first (upper) surface 100a and a second (lower) surface 100b opposite to the first surface 100a. In an exemplary embodiment, for example, the first surface 100a of the substrate 100 may be a surface above which the first LED 300 and the lens 600 are arranged, and the second surface 100b of the substrate 100 may be a surface opposite to the first surface 100a.

As described above, various insulating layers 111, 113, 115 and 117, the first LED 300 and the lens 600 may each be on the first surface 100a of the substrate 100.

The light diffusing layer 700 may be on the second surface 100b of the substrate 100. In an exemplary embodiment of manufacturing the display apparatus 10B, the light diffusing layer 700 may be formed using inkjet printing, screen printing, lamination, spin coating, sputtering, chemical vapor deposition ("CVD"), or the like. In an exemplary embodiment, for example, a medium in which fine particles are dispersed may be coated on the second surface 100b of the substrate 100 and cured by heat curing and/or ultraviolet curing to form the light diffusing layer 700.

The light diffusing layer 700 has a planarization function and also scatters light emitted from the first LED 300 and transmitted at the second area A2, and thus increases light extraction efficiency. The light diffusing layer 700 may include fine particles for light diffusion dispersed over a transparent medium such as a transparent binder. The fine particles may have a size of tens of nm to several μm. The binder may include a transparent material such as acrylic, urethane, and epoxy resin. The fine particles may be transparent organic particles or inorganic particles. The organic particles may include multilayered multicomponent particles obtained by forming acrylic-based particles of methyl methacrylate, acrylic acid, methacrylic acid, hydroxyethyl methacrylate, hydroxypropyl methacrylate, acrylamide, methylol acrylamide, glycidyl methacrylate, ethyl acrylate, isobutyl acrylate, n-butyl acrylate, and 2-ethylhexylmethacrylate homopolymer or copolymer, olefin-based particles such as polyethylene, polystyrene, and polypropylene, and acrylic and olefin-based copolymer particles and homopolymer particles and then covering the layer with another type of monomer. The inorganic particles may include silicon oxide, aluminum oxide, titanium oxide, zirconium oxide, and magnesium fluoride.

Figure 4A:
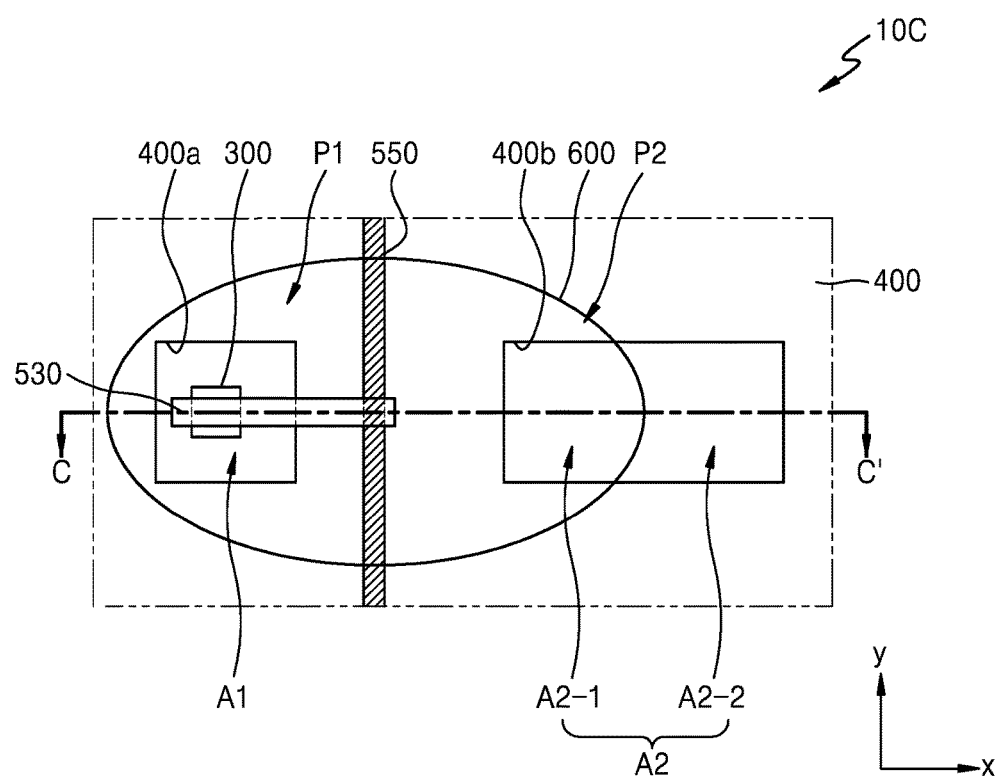
FIG. 4A is an enlarged top plan view illustrating another exemplary embodiment of the region X of FIG. 1.
Figure 4B:
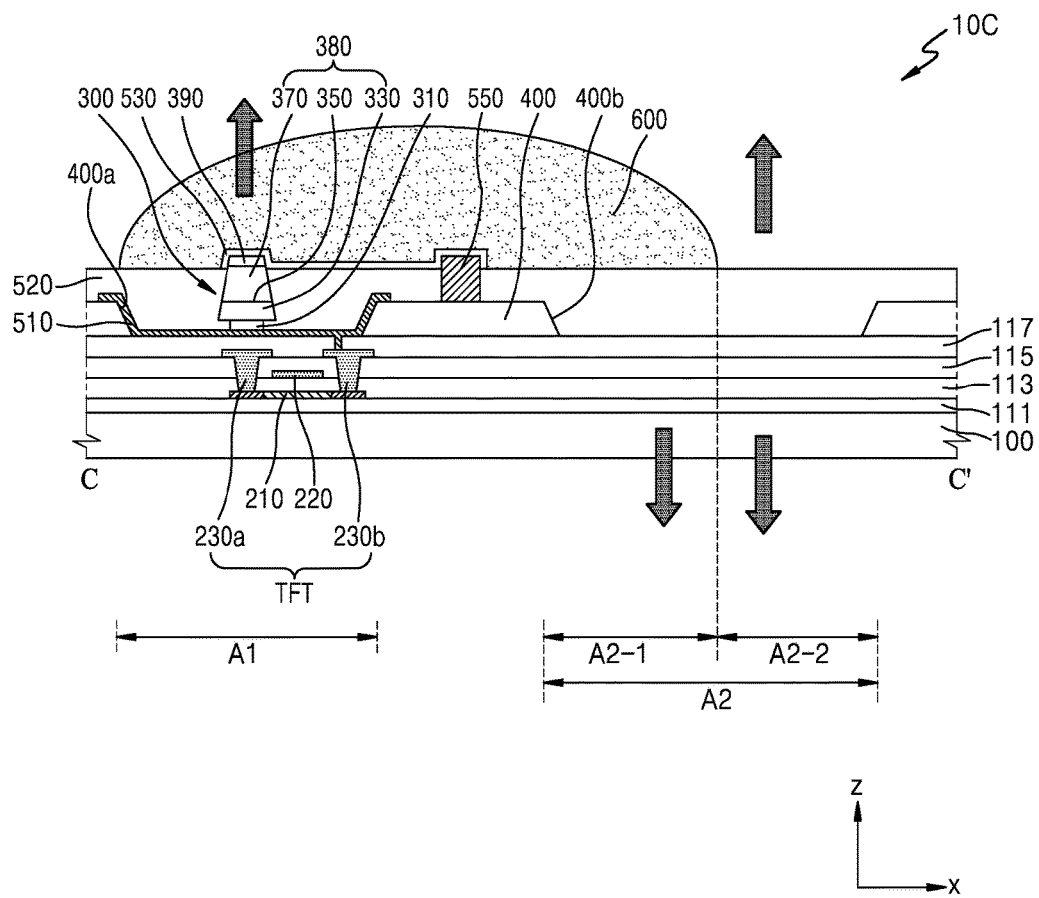
FIG. 4B is a schematic cross-sectional view of the display apparatus of FIG. 4A, taken along line C-C'.

FIG. 4A is an enlarged top plan view illustrating another exemplary embodiment of the region X of FIG. 1, and FIG. 4B is a schematic cross-sectional view of a display apparatus 10C taken along line C-C' of FIG. 4A.

Referring to FIGS. 4A and 4B together, the display apparatus 10C includes the (base) substrate 100 including the first area A1 and the second area A2, the first LED 300 above one surface of the substrate 100 at the first area A1, and the lens 600 commonly over the first area A1 and a portion of the second area A2 of the substrate 100.

The display apparatus 10C according to the exemplary embodiment is different from the above-described display apparatus 10A in terms of the arrangement of the lens 600. Elements such as the thin film transistor TFT and the first LED 300 are the same as those of the display apparatus 10A described with reference to FIGS. 2A and 2B. Thus, a repeated description thereof will be omitted, and the above description of the display apparatus 10A will be cited.

The substrate 100 may include the first area A1 and the second area A2. In this regard, the first area A1 may be non-transmissive, and the second area A2 may be light-transmissive. When the first area A1 is non-transmissive, and the second area A2 is light-transmissive, the substrate 100 itself may be non-transmissive or light-transmissive, or various layers and devices may be arranged on the substrate 100. Due to such layers and devices on the substrate 100, the substrate 100 at an area corresponding to the first area A1 may be non-transmissive, and the substrate 100 at an area corresponding to the second area A2 may be light-transmissive.

Also, being non-transmissive or light-transmissive may not denote that light is totally blocked or totally passes through but also that a relatively larger amount of light passes through the second area A2 of the substrate 100, compared with the first area A1 of the substrate 100.

In the exemplary embodiment, the second area A2 of the substrate 100 may include a 2-1 (first sub) area A2-1 and a 2-2 (second sub) area A2-2. Although FIGS. 4A and 4B illustrate that a planar size of the second area A2 of the substrate 100 is larger than the first area A1, the invention disclosure is not limited thereto. Planar sizes (areas) of the first area A1 and the second area A2 may be variously modified according to design of a top emission area, a bottom emission area and a transparent area of the display apparatus 10C.

The lens 600 may commonly cover the first area A1 and the 2-1 area A2-1 of the substrate 100. The lens 600 is excluded from the 2-2 area A2-2. In the first area A1 of the substrate 100, light emitted from the first LED 300 is top-emissive, and in the 2-1 area A2-1 of the substrate 100, light emitted from the first LED 300 is partially reflected by the lens 600 and bottom-emissive. In this regard, the 2-2 area A2-2 of the substrate 100 that is not covered by the lens 600 may be light-transmissive and thus may serve as a transparent window for the display apparatus 10C, such that light incident from both a lower and upper side passes through the transparent window as indicated by the up and down arrows in FIG. 4B. By utilizing the 2-2 area A2-2 of the substrate 100, a combination dual-emissive and transparent display apparatus may be provided.

Figure 5A:
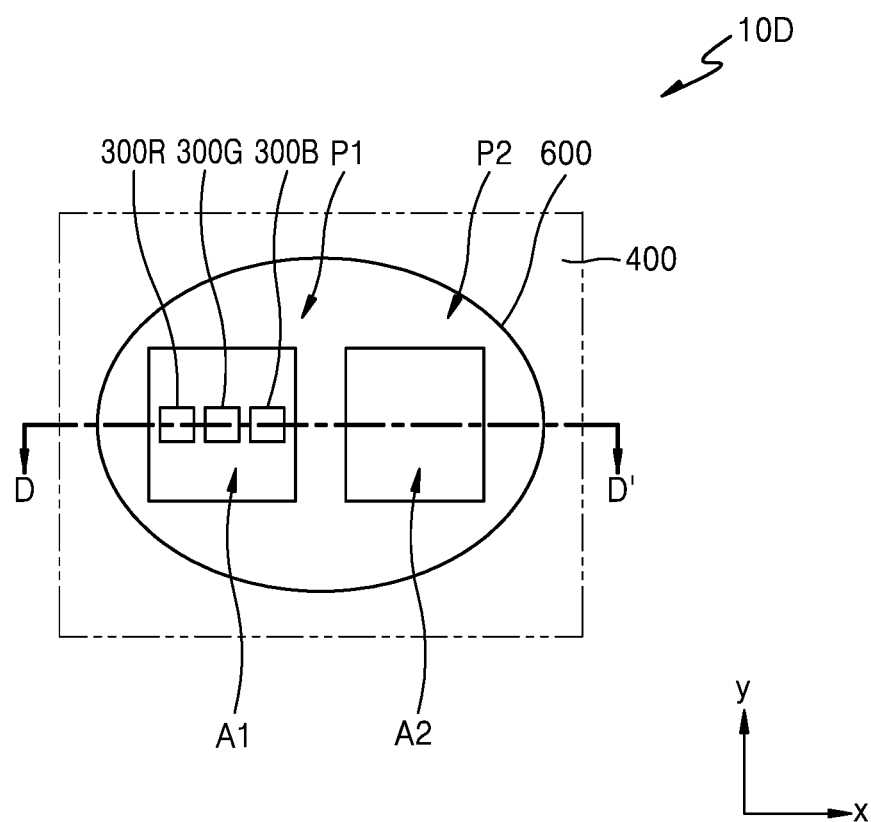
FIG. 5A is an enlarged top plan view illustrating still another exemplary embodiment of the region X of FIG. 1.
Figure 5B:
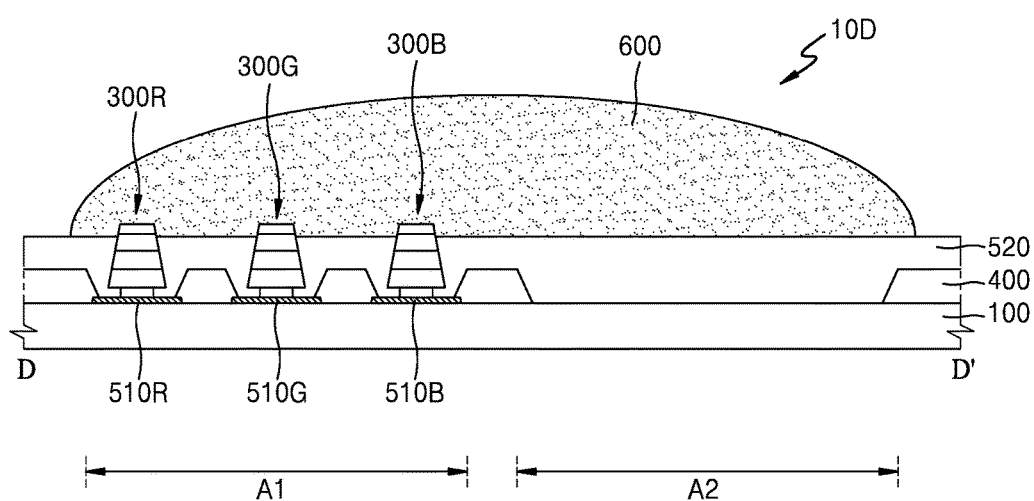
FIG. 5B is a schematic cross-sectional view of the display apparatus of FIG. 5A, taken along line D-D'.

FIG. 5A is an enlarged top plan view illustrating still another exemplary embodiment of the region X of FIG. 1, and FIG. 5B is a schematic cross-sectional view of a display apparatus 10D taken along line D-D' of FIG. 5A.

Referring to FIGS. 5A and 5B together, the display apparatus 10D includes the (base) substrate 100 including the first area A1 and the second area A2, a first LED 300R, a second LED 300G and a third LED 300B above one surface of the substrate 100 at the first area A1, and the lens 600 commonly over the first area A1 and a portion of the second area A2 of the substrate 100.

In the display apparatus 10D according to the exemplary embodiment, the first area A1 of the substrate 100 includes a plurality of LEDs 300R, 300G and 300B. That is, it may be construed as meaning that the lens 600 over the first area A1 and the second area A2 of the substrate 100 is provided, and the plurality of LEDs 300R, 300G and 300B are arranged above the first area A1. Although FIG. 5B illustrates, for convenience of description, a plurality of pixel electrodes 510R, 510G and 510B arranged on the first area A1 of the substrate 100 and the LEDs 300R, 300G and 300B arranged correspondingly with respect to the plurality of pixel electrodes 510R, 510G and 510B, respectively, various layers and a plurality of thin film transistors may be arranged on the substrate 100, as shown in FIG. 2B, and the pixel electrodes 510R, 510G and 510B may be arranged so as to be electrically connected to the plurality of thin film transistors, respectively. Accordingly, the description of FIG. 2B will be cited for the details of the various layers and the thin film transistors arranged between the substrate 100 and the pixel electrodes 510R, 510G and 510B.

The substrate 100 may include the first area A1 and the second area A2. In this regard, the first area A1 may be non-transmissive, and the second area A2 may be light-transmissive. When the first area A1 is non-transmissive, and the second area A2 is light-transmissive, the substrate 100 itself may be non-transmissive or light-transmissive, or various layers and devices may be arranged on the substrate 100. Due to such layers and devices on the substrate 100, the substrate 100 at an area corresponding to the first area A1 may be non-transmissive, and the substrate 100 at an area corresponding to the second area A2 may be light-transmissive.

The first LED 300R, the second LED 300G and a third LED 300B may be above the first area A1 of the substrate 100. In this case, the first LED 300R may emit (R) red wavelength light, the second LED 300G may emit green (G) wavelength light, and the third LED 300B may emit blue (B) wavelength light. Although FIGS. 5A and 5B illustrate the three LEDs 300R, 300G and 300B above the first area A1 of the substrate 100, the LEDs 300R, 300G and 300B respectively emitting R, G and B lights, at least two LEDs may be above the first area A1 of the substrate 100. Although not illustrated, in another exemplary embodiment, a fourth LED (not shown) that emits white wavelength light may be further above the first area A1 of the substrate 100.

In the previous exemplary embodiments, one LED is disposed in the lens 600, whereas, in the display apparatus 10D of FIG. 5B, a plurality of LEDs are arranged in the lens 600. That is, it may be construed as meaning that, in the previous exemplary embodiments, the lens is disposed with respect to each sub-pixel, whereas, in the display apparatus 10D of FIG. 5B, the lens 600 is disposed with respect to each pixel an commonly to all sub-pixels thereof, where the pixel includes at least two sub-pixels. Thus, the number of lenses 600 may be decreased, and accordingly, processes may be effective, and when R, G and B are simultaneously emitted, white light may be emitted due to color mixture.

Although a display apparatus having a dual light emission structure for achieving a dual display structure has been mainly described so far, the invention disclosure is not limited thereto. As another example, a lighting apparatus separate from a display unit and having the same dual light emission structure as that of the above-described display apparatus may also be encompassed in the scope of the invention.

Figure 6:
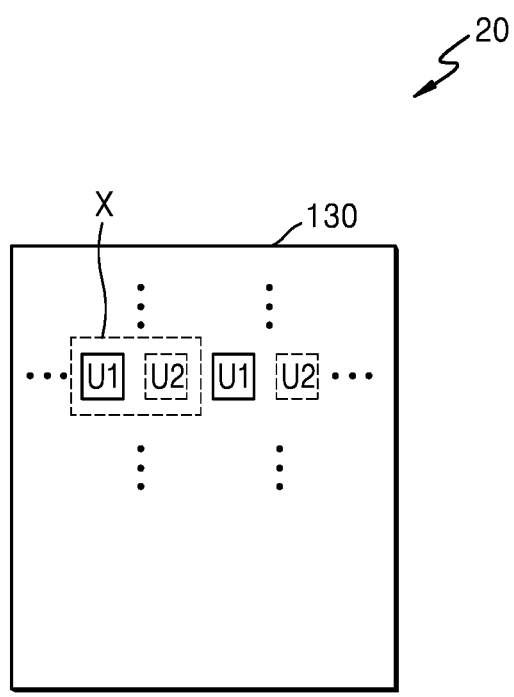
FIG. 6 is a schematic cross-sectional view of an exemplary embodiment of a lighting apparatus according to the invention.

FIG. 6 is a schematic cross-sectional view of an exemplary embodiment of a lighting apparatus 20 according to the invention.

Referring to FIG. 6, the lighting apparatus 20 may include a light generating panel member 130 (otherwise referred to as a lighting unit 130). The lighting unit 130 may include a plurality of (light) emission units such as U1 and U2 arranged in a matrix form on a (base) substrate 100. The plurality of emission units U1 and U2 may include a first emission unit U1 and a second emission unit U2. According to the exemplary embodiment, the first emission unit U1 may emit light upwards from the first surface 100a (FIG. 8), and the second emission unit U2 may emit light downwards from the first surface 100a and toward the second surface 100b (FIG. 8) opposite to the first surface 100a. That is, the first emission unit U1 may be construed as a top emission type pixel, and the second emission unit U2 may be construed as a bottom emission type pixel. The first emission unit U1 and the second emission unit U2 may be provided as a pair in the lighting unit 130.

Figure 7A:
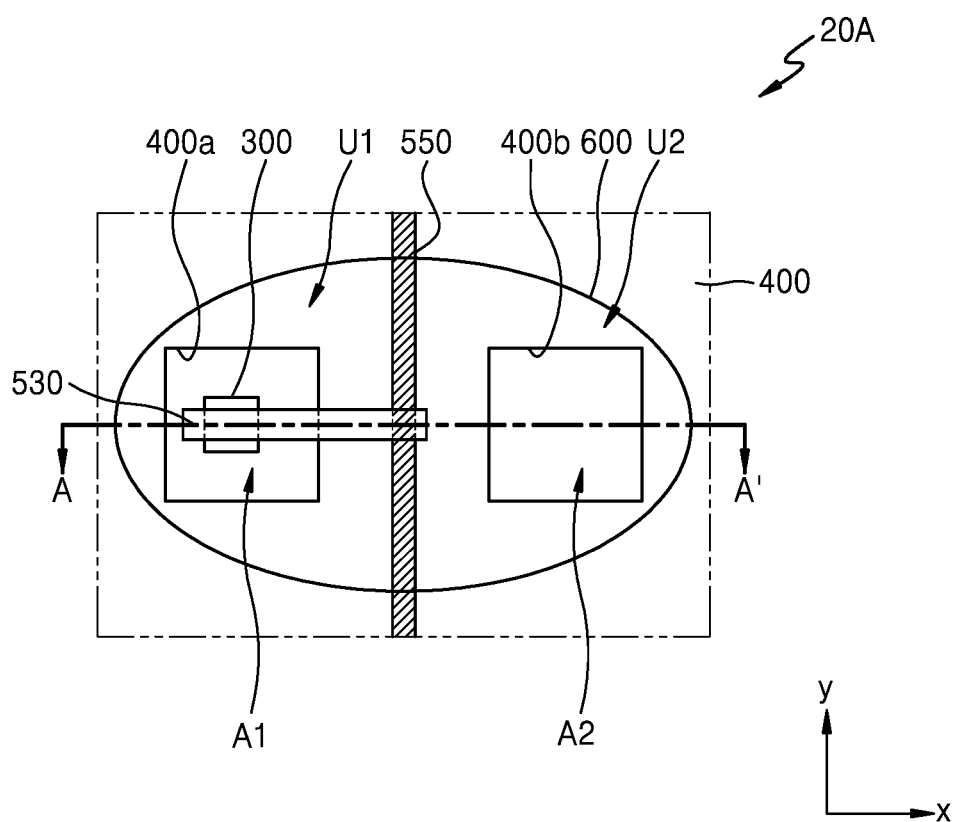
FIG. 7A is an enlarged top plan view illustrating the region X of the lighting apparatus of FIG. 6.
Figure 7B:
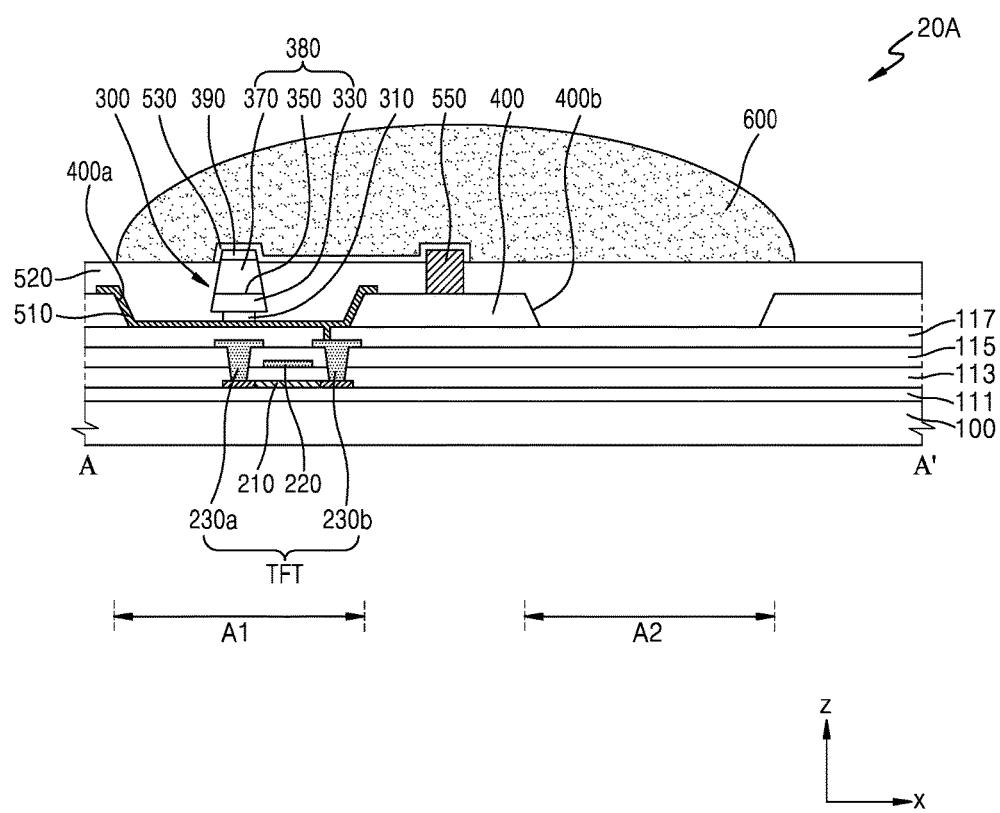
FIG. 7B is a schematic cross-sectional view of the lighting apparatus of FIG. 7A, taken along line A-A'.

FIG. 7A is an enlarged top plan view illustrating the region X of the lighting apparatus of FIG. 6, and FIG. 7B is a schematic cross-sectional view of a lighting apparatus 20A taken along line A-A' of FIG. 7A.

Referring to FIGS. 7A and 7B together, the lighting apparatus 20A includes the (base) substrate 100 including the first area A1 and the second area A2, an LED 300 above the substrate 100, and the lens 600 commonly over the first area A1 and the second area A2 of the substrate 100.

The substrate 100 may include one or more materials, such as glass, metal, or plastic, for example, PET, PEN, polyimide, etc. The substrate 100 including one or more the above-described material may be rigid or flexible.

According to the exemplary embodiment, the substrate 100 may include the first area A1 and the second area A2 adjacent to each other within the region X. In this regard, the first area A1 may be non-transmissive, and the second area A2 may be light-transmissive. When the first area A1 is non-transmissive, and the second area A2 is light-transmissive, the substrate 100 itself may be non-transmissive or light-transmissive, or various layers and devices may be arranged on the substrate 100. Due to such layers and devices on the substrate 100, the substrate 100 at an area corresponding to the first area A1 of the substrate 100 may be non-transmissive, and the substrate 100 an area corresponding to the second area A2 may be light-transmissive.

Also, being non-transmissive or light-transmissive may not denote that light is totally blocked or totally passes through but also that a relatively larger amount of light passes through the second area A2 of the substrate 100, through compared with the first area A1 of the substrate 100.

The first emission unit U1 may include the LED 300 and a circuit connected to the LED 300. The circuit may include at least one thin film transistor and at least one capacitor. The circuit is connected to each of a scan line and a data line of the lighting unit 130 which cross each other (not shown). In FIG. 7B, only one thin film transistor TFT is shown. The plurality of emission units may provide light to a separate display unit under control of the circuit.

The buffer layer 111 may be provided on the substrate 100, and the thin film transistor TFT may be provided on the buffer layer 111. The buffer layer 111 may reduce or effectively prevent intrusion of impurities through the substrate 100, may planarize a surface, and/or may include a single layer or layers including an inorganic material such as silicon nitride ($SiN_x$) and/or silicon oxide ($SiO_x$).

The thin film transistor TFT includes the active layer 210, the gate electrode 220, the source electrode 230a and the drain electrode 230b. The active layer 210 may include a semiconductor material and defines a source region, a drain region, and a channel region which is between the source region and the drain region (shown with different hatching patterns).

The gate electrode 220 is disposed or formed above the active layer 210 in the thickness direction of the lighting unit 130 so as to correspond to the channel region of the active layer 210. The source electrode 230a and the drain electrode 230b are electrically connected to the source region and the drain region of the active layer 210, respectively. As a gate insulating layer, the first insulating layer 113 is between the active layer 210 and the gate electrode 220, the first insulating layer 113 including an inorganic insulating material. As an interlayer insulating layer, the second insulating layer 115 is respectively between the gate electrode 220 and the source and drain electrodes 230a and 230b. The third insulating layer 117 is on the source and drain electrodes 230a and 230b as a planarization layer. The second insulating layer 115 and the third insulating layer 117 may each include or be formed using an organic insulating material or inorganic insulating material, or alternating an organic insulating material and an inorganic insulating material.

Although the thin film transistor TFT of FIG. 7B is a top gate type having a gate electrode above an active layer in the thickness direction, the invention is not limited thereto, and the gate electrode may be below the active layer in the thickness direction to form a bottom gate type thin film transistor TFT.

In addition, according to the exemplary embodiment, the thin film transistor TFT may be above or in the first area A1 of the substrate 100. The first area A1 of the substrate 100 is a non-transmissive area, and devices such as the thin film transistor TFT may be arranged at the first area A1 of the substrate 100. In other words, devices including the thin film transistor TFT or wirings may not be arranged at the second area A2 of the substrate 100. The second area A2 of the substrate 100 is a light-transmissive area at which light passes through the second area A2 of the substrate 100. Therefore, devices (e.g., the thin film transistor TFT or wirings) which may degrade light transmission at the second area A2 may not be arranged in a travelling direction of light at the second area A2.

The bank layer 400 may be on the third insulating layer 117 and define a pixel region of the pixels. The bank layer 400 may include or define the first opening 400a corresponding to the first area A1 of the substrate 100 and the second opening 400b corresponding to the second area A2 of the substrate 100. An LED may be located in the first opening 400a of the bank layer 400. In contrast, no LED is disposed in the second opening 400b of the bank layer 400. A height of the bank layer 400 may be determined according to a height and a viewing angle of the LED. The height of the bank layer 400 may be taken from the surface of the third insulating layer 117. Also, sizes (e.g., widths) of the first opening 400a and the second opening 400b may be determined according to factors such as the resolution and pixel density of the display apparatus 10.

In an exemplary embodiment, the height of the LED 300 may be greater than the height of the bank layer 400. The widths of the openings defined by the bank layer 400 may be taken in a direction parallel to a plane of the substrate 100 (e.g., x-axis (x) direction or y-axis (y) direction in FIG. 7A, and horizontal (x direction) in FIG. 7B). Although FIG. 7A illustrates an example in which the first opening 400a and the second opening 400b are quadrangles, embodiments are not limited thereto, and the first opening 400a and the second opening 400b may have various shapes, such as polygons, rectangles, circles, circular cones, ovals, or triangles, being the same or different from each other.

The conductive layer 550, which is electrically connected to the second electrode 530, is on the bank layer 400. Alternatively, although not illustrated, a conductive layer may be omitted, and the second electrode 530 may be formed, as a common electrode that is common to each of the emission units U1 and U2, entirely over the substrate 100. The conductive layer 550 may be in a direction parallel to the data line or the scan line. In an exemplary embodiment, the conductive layer 550, the data line and the scan line may each define a length thereof larger than a width thereof, and the length of the conductive layer 550 may be parallel to that of the data line or the gate line.

The bank layer 400 may include a material that at least partially absorbs light, a light-reflecting material, or a light-scattering material. The bank layer 400 may include an insulating material that is semi-transparent or non-transparent with respect to visible light (for example, light corresponding to a wavelength range of 380 nm to 750 nm). The bank layer 400 may include an organic insulating material, for example, thermoplastic resin such as PC, PET, PES, PVB, PPE, polyamide, PEI, norbornene system resin, methacrylic resin, and cyclic polyolefin base, thermosetting resin such as epoxy resin, phenol resin, urethane resin, acrylic resin, vinyl ester resin, imide-based resin, urethane-based resin, urea resin, and melamine resin, polystyrene, or polyacrylonitrile, but a material of the bank layer 400 is not limited thereto. The bank layer 400 may include an inorganic insulating material, for example, an inorganic oxide or an inorganic nitride, such as SiOx, SiNx, SiNxOy, AlOx, TiOx, TaOx, and ZnOx, but the material of the bank layer 400 is not limited thereto.

In an exemplary embodiment, the bank layer 400 may include a non-transparent material such as a black matrix material. An insulating black matrix material may include resin or paste including organic resin, glass paste, and black pigment, metal particles, for example, nickel, aluminum, molybdenum, and an alloy thereof, metal oxide particles (for example, chromium oxide), or metal nitride particles (for example, chromium nitride). In another embodiment, the bank layer 400 may be a DBR having high reflectivity or a mirror reflector formed of metal.

The LED 300 as a point light source may be in the first opening 400a of the bank layer 400. The LED 300 may be a micro LED. Here, the term "micro" may refer to a size of about 1 μm to about 100 μm. However, embodiments are not limited thereto, and the LED may have a larger or smaller size than that described above. In an exemplary embodiment of manufacturing the display apparatus 10, the LED 300 may be transferred individually or in plural on a wafer such as by a transport mechanism and transferred onto the substrate 100 and thus may be placed in the first opening 400a of the substrate 100.

In an exemplary embodiment, the bank layer 400 and the first electrode 510 may be disposed or formed above the first area A1 of the substrate 100, and then, the LED 300 may be placed in the first opening 400a above the first area A1 and on the first electrode 510. In another exemplary embodiment, the conductive layer 550 may be additionally disposed or formed, and then, the LED 300 may be transferred onto the substrate 100 and thus may be held in the first opening 400a above the first area A1. The LED 300 may be a red, green, blue, or white LED or UV LED.

In an exemplary embodiment, the lighting apparatus 20 and 20A may be used for the same purpose as that of a back light unit ("BLU") of a non-self emissive display apparatus such as liquid crystal display apparatus. In this case, a white LED that emits white light may be used as the LED 300, but the invention is not limited thereto.

The LED 300 may include the p-n diode 380, the first contact electrode 310, and the second contact electrode 390. The first contact electrode 310 and/or the second contact electrode 390 may include one or more layers and may be formed using various conductive materials including metal, conductive oxide, and conductive polymers. The first contact electrode 310 and the second contact electrode 390 may each optionally include a reflective layer, for example, a silver layer. The first contact electrode 310 is electrically connected to the first electrode 510, and the second contact electrode 390 is electrically connected to the second electrode 530. The p-n diode 380 may include the lower p-doping layer 330, the one or more quantum well layers 350, and the upper n-doping layer 370. In another exemplary embodiment, the upper doping layer 370 may be a p-doping layer, and the lower doping layer 330 may be an n-doping layer. In a cross-sectional view, the p-n diode 380 may have a straight side wall or a side wall tapered downward or upward.

The first electrode 510 may be a (semi)transparent electrode or reflective electrode and may include one or more layers. In an exemplary embodiment, for example, the first electrode 510 may include metal such as aluminum, molybdenum, titanium, titanium and tungsten, silver, gold, or an alloy thereof. The first electrode 510 may include a transparent conductive layer including a conductive material, such as a TCO, for example, ITO, IZO, ZnO, or $In_2O_3$, a carbon nanotube film, or a transparent conductive polymer, and a reflective layer. In an exemplary embodiment, the first electrode 510 may be a triple layer including upper and lower transparent conductive layers and a reflective layer between the upper and lower transparent conductive layers.

The second electrode 530 may be a transparent or semi-transparent electrode. In an exemplary embodiment, for example, the second electrode 530 may be formed using a material among the above-described transparent conductive materials and may include one or more materials selected from Ag, Al, Mg, Li, Ca, Cu, LiF/Ca, LiF/Al, MgAg, and CaAg.

In an exemplary embodiment, when, without the conductive layer present, the second electrode 530 is formed as a common electrode above the substrate 100, the second electrode 530 may be formed as a transparent electrode by taking into account light transmission of the second area A2 of the substrate 100.

The passivation layer 520 may be on the bank layer 400 and within the first opening 400a and the second opening 400b. The passivation layer 520 may surround the LED 300 in the first opening 400a. The passivation layer 520 fills space between the bank layer 400 and the LED 300 and thus covers the first opening 400a and the first electrode 510. As described above, the passivation layer 520 may fill space in the first opening 400a and the second opening 400b and thus planarize a surface on which the lens 600 is disposed or formed.

The passivation layer 520 may include an organic insulating material that is light-transmissive. In an exemplary embodiment, for example, the passivation layer 520 may include acrylic, PMMA, BCB, polyimide, acrylate, epoxy, and polyester, but a material of the passivation layer 520 is not limited thereto. The passivation layer 520 does not cover an upper portion of the LED 300, for example, the second contact electrode 390, and thus, the second contact electrode 390 is exposed by the passivation layer 520. The second electrode 530, which is commonly electrically connected to the exposed second contact electrode 390 of the LED 300 and the conductive layer 550, is disposed or formed on the passivation layer 520.

Although FIG. 7B shows a vertical micro LED as an example, one or more embodiments are not limited thereto, and the LED 300 may be a flip-type micro LED where a first contact electrode and a second contact electrode face the same direction, a horizontal micro LED, or the like. In this case, locations of a first electrode and a second electrode may correspond to those of the first contact electrode and the second contact electrode.

The lens 600 may be on the passivation layer 520. The lens 600 may be commonly over the first area A1 and the second area A2 of the substrate 100 so as to cover the LED 300. That the lens 600 is over the first area A1 and the second area A2 of the substrate 100 may denote that the lens 600 entirely covers the first area A1 and the second area A2 of the substrate 100 or that the lens 600 at least partially covers the first area A1 and the second area A2 of the substrate 100.

The lens 600 may have an oval shape. Here, the oval shape may be understood as a circle extending or contracting in one direction. This may denote that a portion of a surface of the lens 600 that passes the LED 300 and crosses an imaginary plane perpendicular to the substrate 100 has an oval shape. In FIG. 7A, a cross section of the lens 600 taken along a plane defined by the x-axis and the y-axis has an oval shape, and in FIG. 7B, a cross-section of the lens 600 taken along a plane defined by the x-axis and the z-axis (z) is a portion of an oval shape. However, the invention is not limited thereto, and it is enough only if the portion of the surface of the lens 600 that passes the LED 300 and crosses the imaginary plane perpendicular to the substrate 100 has an oval shape, and the entire shape of the lens 600 may be modified by taking into account a factor such as a light extraction amount or direction.

In the exemplary embodiment, with reference to a central portion of the lens 600, the first area A1 may be at one side of a central portion of the lens 600, and the second area A2 may be at the other side of the central portion of the lens 600. When the lens 600 is completely oval, the central portion of the lens 600 may be understood as the center defined by the oval shape. However, when the lens 600 is not completely oval, the central portion of the lens 600 may be understood as an area between a first focus and a second focus, which are to be described below.

With reference to an ellipse, the lens 600 having a general oval shape as described above may have the first focus and the second focus. In an optical approach to the first focus and the second focus of the oval, light and radio waves from one focus of an oval mirror plane is reflected by the oval plane and then reaches the other focus. Regardless of the direction in which the light and radio waves are sent from the focus, the result is the same.

Accordingly, in the exemplary embodiment and with reference to an ellipse, the LED 300 may be at a location corresponding to the first focus of the lens 600. Also, the second focus of the lens 600 may be located so as to correspond to the second area A2 of the substrate 100. Although light emitted from the LED 300 located at the first focus of the lens 600 basically has properties of travelling straight and thus is emitted in a light-emitting direction, the light is partially reflected by the surface of the lens 600 and incident on the second area A2 of the substrate 100 where the second focus of the lens 600 is located. Through the reflection of the light, top emission occurs in the first area A1 of the substrate 100, and bottom emission occurs in the second area A2 of the substrate 100 so as to achieve a dual light emission of the lighting unit 130.

In the related art, individual lighting panels each emitting light in one direction are disposed with light emission directions opposite to each other in order to provide a dual lighting apparatus, and thus, a dual light emission type lighting apparatus is formed. In the lighting apparatus including the lighting unit 130 such as one according to one or more exemplary embodiment, since the lighting unit 130 emits light in both of opposing directions, a dual lighting apparatus may be provided using a single light generating panel having the above-described structure.

Figure 8:
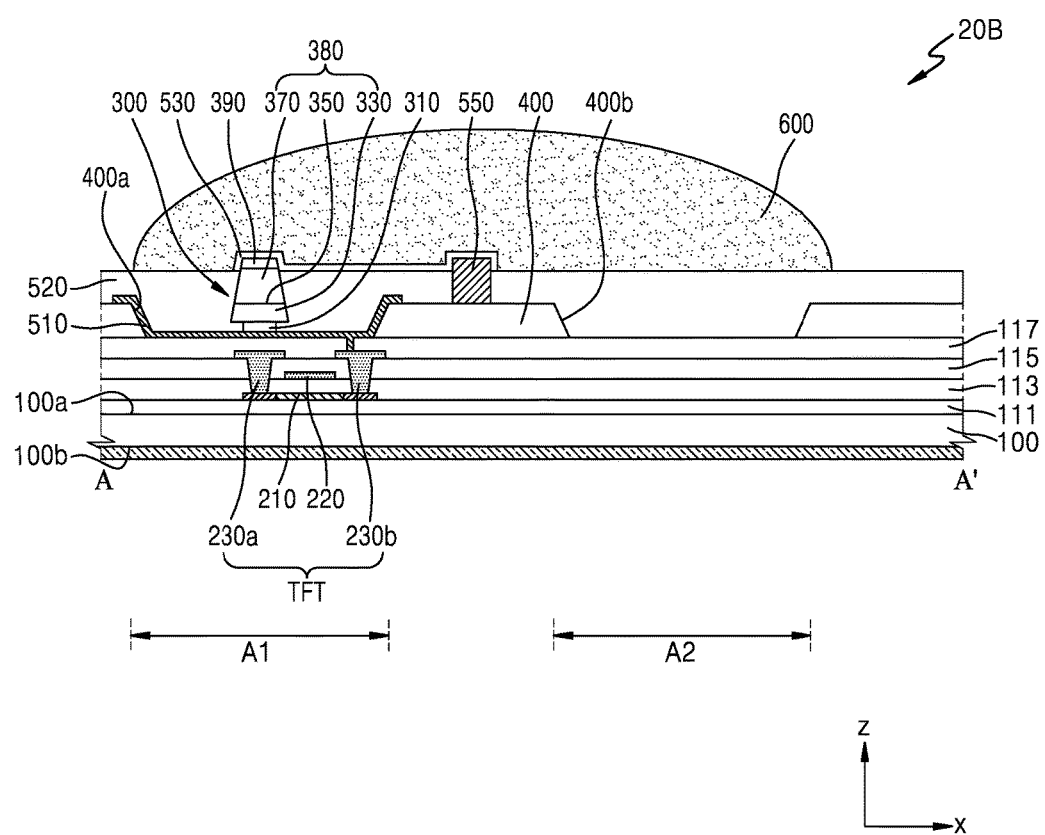
FIG. 8 is a schematic cross-sectional view of another exemplary embodiment of a lighting apparatus taken along line A-A' of FIG. 7A.

FIG. 8 is a schematic cross-sectional view of another exemplary embodiment of a lighting apparatus 20B taken along line A-A' of FIG. 7A.

Elements of the lighting apparatus 20B, except the light diffusing layer 700, are the same as those of the lighting apparatus 20A described with reference to FIGS. 7A and 7B. Thus, a repeated description thereof will be omitted, and the above description of the lighting apparatus 20A will be cited. The light diffusing layer 700 will be mainly described hereinafter.

The substrate 100 may include the first (upper) surface 100a and the second (lower) surface 100b opposite to the first surface 100a. In an exemplary embodiment, for example, the first surface 100a of the substrate 100 may be a surface above which the LED 300 and the lens 600 are arranged, and the second surface 100b of the substrate 100 may be a surface opposite to the first surface 100a.

As described above, various insulating layers 111, 113, 115, and 117, the LED 300 and the lens 600 may be on the first surface 100a of the substrate 100.

The light diffusing layer 700 may be on the second surface 100b of the substrate 100. In an exemplary embodiment of manufacturing the lighting apparatus 20B, the light diffusing layer 700 may be formed using inkjet printing, screen printing, lamination, spin coating, sputtering, CVD, or the like. In an exemplary embodiment, for example, a medium in which fine particles are dispersed may be coated on the second surface 100b of the substrate 100 and cured by heat curing and/or ultraviolet curing to form the light diffusing layer 700.

The light diffusing layer 700 has a planarization function and also scatters light emitted from the LED 300 and transmitted at the second area A2, and thus increases light extraction efficiency. The light diffusing layer 700 may include fine particles for light diffusion dispersed over a transparent medium such as a transparent binder. The fine particles may have a size of tens of nm to several μm. The binder may include a transparent material such as acrylic, urethane, and epoxy resin. The fine particles may be transparent organic particles or inorganic particles. The organic particles may include multilayered multicomponent particles obtained by forming acrylic-based particles of methyl methacrylate, acrylic acid, methacrylic acid, hydroxyethyl methacrylate, hydroxypropyl methacrylate, acrylamide, methylol acrylamide, glycidyl methacrylate, ethyl acrylate, isobutyl acrylate, n-butyl acrylate, and 2-ethylhexylmethacrylate homopolymer or copolymer, olefin-based particles such as polyethylene, polystyrene, and polypropylene, and acrylic and olefin-based copolymer particles and homopolymer particles and then covering the layer with another type of monomer. The inorganic particles may include silicon oxide, aluminum oxide, titanium oxide, zirconium oxide, and magnesium fluoride.

Figure 9:
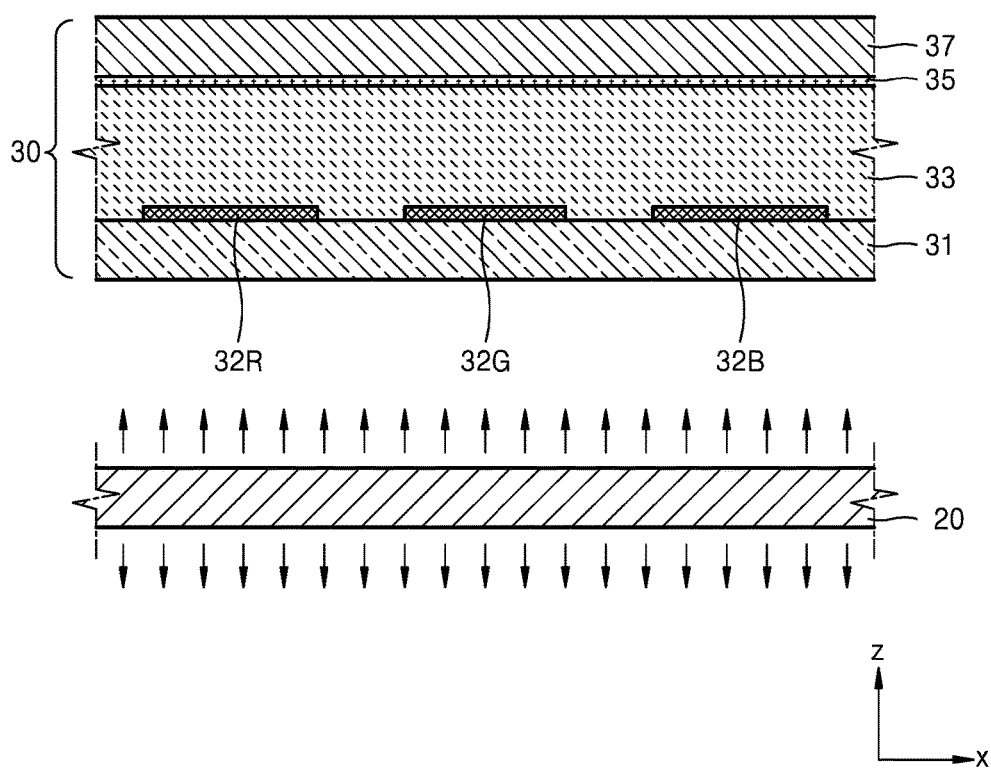
FIG. 9 is a schematic cross-sectional view of an exemplary embodiment of a liquid crystal display apparatus including a lighting apparatus according to the invention.

FIG. 9 is a schematic cross-sectional view of an exemplary embodiment of a liquid crystal display apparatus representing a non-self emissive display apparatus, according to the invention. In FIG. 9, the lighting apparatus 20, 20A and 20B according to one or more of the previous exemplary embodiments serves as the BLU of the liquid crystal display apparatus.

FIG. 9 is a schematic cross-sectional view illustrating a portion of a liquid crystal display apparatus according to an exemplary embodiment. The liquid crystal display apparatus according to the exemplary embodiment includes a display (panel) 30 including liquid crystal devices as display-generating devices and the lighting apparatus 20 separate from the display 30 and generating and irradiating light toward the display 30.

A substrate base 31 may be light-transmissive and may be a substrate including or formed of glass or a substrate including a polymer material such as polyimide. A plurality of display-generating devices are arranged on the substrate 31. As illustrated in FIG. 9, the display-generating devices may be liquid crystal devices including liquid crystals 33 between a collection of pixel electrodes 32R, 32G and 32B and a common electrode 35. The display-generating devices may further respectively include a thin film transistor with which the display-generating devices are controlled to display an image. The pixel electrodes 32R, 32G and 32B and the common electrode 35 may also include light-transmissive materials, such as ITO, IZO, ZnO, or In$_2$O$_3$, so as to be light-transmissive. Since thin film transistors may be electrically connected to the pixel electrodes 32R, 32G and 32B, for this, a thin film transistor layer (not shown), etc. may be provided between the substrate 31 and the pixel electrodes 32R, 32G and 32B.

Here, various modifications may be made, for example, unlike that illustrated in FIG. 9, an alignment layer, etc. may be further provided on the pixel electrodes 32R, 32G and 32B and/or the common electrode 35. In addition, although not illustrated, color filters (not shown) may be located above the pixel electrodes 32R, 32G, and 32B in a light emission direction of the display 30 so as to correspond to the respective pixel electrodes 32R, 32G and 32B. The color filters (not shown) may be on an encapsulation substrate 37.

In an embodiment, the lighting apparatus according to one or more exemplary embodiments of the invention may be used as the BLU of the liquid crystal display apparatus. The lighting apparatus may be located below the display 30 and may generate light and irradiate the generated light toward the display 30. Since the lighting apparatus according to one or more of the exemplary embodiments are dual light emission types, the display 30 may be provided in plural within the liquid crystal display apparatus, such as respectively at opposing sides of a single lighting apparatus to provide a dual display type liquid crystal display apparatus.

The lighting apparatus 20 as described above may be light-transmissive because, when the lighting apparatus 20 is light-transmissive, a user may recognize a rear of the dual display type liquid crystal display apparatus, specifically, a background of a rear of the lighting apparatus 20, in a transparent mode.

As described above, for a liquid crystal display apparatus using a liquid crystal device as a display-generating device, the liquid crystal device itself is not a light-generating or light-emitting device, and accordingly, a visible ray light source is additionally provided. For this, the lighting apparatus 20 may irradiate light toward the display devices via the substrate 31. Thus, when the lighting apparatus emits light, transmittance of the emitted light may be controlled by the liquid crystal device so that the user may recognize a full-color image.

According to one or more embodiments, there may be provided a dual image display apparatus and a dual light emission lighting apparatus having relatively simple manufacturing processes and small thicknesses. However, the invention is not limited thereto.

It should be understood that exemplary embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate comprising:
   a first area at which an image is displayed in a first direction with light, and
   a second area at which an image is displayed in a second direction opposite to the first direction with light, wherein a portion of the substrate at the second area is light-transmissive;
   a first light-emitting member on the substrate and disposed in the first area of the substrate; and
   a lens commonly disposed over the first area and the second area of the substrate so as to cover the first light-emitting member,
   wherein
   at the first area, the light with which the image is displayed in the first direction passes through the lens, and
   at the second area, the light with which the image is displayed in the second direction opposite to the first direction passes through the substrate.

2. The display apparatus of claim 1, wherein a portion of the substrate at the first area is non-transmissive.

3. The display apparatus of claim 1, wherein
   in a direction in which the first and second areas are adjacent to each other, the lens defines a central portion thereof, and
   with respect to the central portion of the lens, the first area is at a first side of the central portion of the lens, and the second area is at a second side of the central portion of the lens opposite to the first side thereof.

4. The display apparatus of claim 1, wherein the lens has a shape of an ellipse which defines a first focus and a second focus thereof.

5. The display apparatus of claim 4, wherein for the lens having the shape of the ellipse, a location of the first light-emitting member corresponds to the first focus.

6. The display apparatus of claim 4, wherein for the lens having the shape of the ellipse, the second area of the substrate corresponds to the second focus.

7. The display apparatus of claim 1, further comprising on the substrate:
   a thin film transistor which is disposed in the first area of the substrate and controls the first light-emitting member; and
   a first electrode electrically connected to the thin film transistor,
   wherein the thin film transistor in the first area of the substrate is not in the second area of the substrate.

8. The display apparatus of claim 1, further comprising a bank layer on the substrate and defining a first opening corresponding to the first area and a second opening corresponding to the second area,
   wherein the first light-emitting member is disposed in the first opening.

9. The display apparatus of claim 1, further comprising a light diffusing layer,
   wherein
   the substrate defines a first surface thereof and a second surface thereof opposite to the first surface,
   the first light-emitting member and the lens are on the first surface of the substrate, and
   the light diffusing layer is on the second surface of the substrate.

10. The display apparatus of claim 1, further comprising a second light-emitting member on the substrate and disposed in the first area of the substrate,
    wherein the lens commonly covers the first and second light-emitting members.

11. The display apparatus of claim 10, wherein a wavelength of light emitted from the first light-emitting member is different from that of light emitted from the second light-emitting member.

12. A display apparatus comprising:
    a first pixel unit and a second pixel unit adjacent to each other;
    a substrate comprising a first area and a second area respectively corresponding to the first pixel unit and the second pixel unit, wherein a portion of the substrate at the second area is light-transmissive;
    a first light-emitting member on the substrate and disposed in the first area of the substrate; and
    a lens commonly disposed over the first area and the second area of the substrate so as to cover the first light-emitting member,
    wherein
    a total of the second area of the substrate is defined by a first sub-area and a second sub-area adjacent to each other,
    the lens commonly covers the first area and the first sub-area of the second area, and
    the lens does not cover the second sub-area of the second area.

13. A lighting apparatus comprising:
    a light-emitting panel which generates and provides light to a display unit of a display apparatus, wherein the display unit generates and displays an image with the light provided from the light-emitting panel,
    the light-emitting panel comprising:
    a substrate comprising:
    a first area at which light is emitted in a first direction, and
    a second area at which light is emitted in a second direction opposite to the first direction, wherein the second area of the substrate is light-transmissive;

a first light-emitting member on the substrate and disposed in the first area of the substrate; and a lens commonly disposed over the first area and the second area of the substrate so as to cover the first light-emitting member, wherein at the first area, an image is displayed with the light emitted in the first direction which has passed through the lens, and at the second area, an image is displayed with the light emitted in the second direction opposite to the first direction which has passed through the substrate.

14. The lighting apparatus of claim 13, wherein the first area of the substrate is non-transmissive.

15. The lighting apparatus of claim 13, wherein the lens has a shape of an ellipse which defines a first focus and a second focus thereof.

16. The lighting apparatus of claim 15, wherein for the lens having the shape of the ellipse, a location of the first light-emitting member corresponds to the first focus.

17. The lighting apparatus of claim 15, wherein for the lens having the shape of the ellipse, the second area of the substrate corresponds to the second focus.

18. The lighting apparatus of claim 17, wherein the light-emitting panel further comprises: a bank layer on the substrate and defining a first opening corresponding to the first area and a second opening corresponding to the second area, and the first light-emitting member is disposed in the first opening.

19. The lighting apparatus of claim 13, wherein the light-emitting panel further comprises:

a thin film transistor which is disposed in the first area of the substrate and controls the first light-emitting member; and a first electrode electrically connected to the thin film transistor, wherein the thin film transistor disposed in the first area of the substrate is not in the second area of the substrate.

20. The lighting apparatus of claim 13, wherein the light-emitting panel further comprises a light diffusing layer, the substrate defines a first surface thereof and a second surface thereof opposite to the first surface, the first light-emitting member and the lens are on the first surface of the substrate, and the light diffusing layer is on the second surface of the substrate.

* * * * *